(12) United States Patent
Kang et al.

(10) Patent No.: US 10,446,495 B2
(45) Date of Patent: Oct. 15, 2019

(54) METHODS OF FORMING AN ULTRA-LOW-K DIELECTRIC LAYER AND DIELECTRIC LAYERS FORMED THEREBY

(71) Applicant: Samsung Electronics Co., Ltd., Suwon-si (KR)

(72) Inventors: Yoonhee Kang, Changwon-si (KR); Jiyoung Kim, Seoul (KR); Taejin Yim, Yongin-si (KR); Jongmin Baek, Seoul (KR); Sanghoon Ahn, Goyang-si (KR); Hyeoksang Oh, Suwon-si (KR); Kyu-Hee Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 15/909,390

(22) Filed: Mar. 1, 2018

(65) Prior Publication Data

US 2019/0043809 A1    Feb. 7, 2019

(30) Foreign Application Priority Data

Aug. 2, 2017 (KR) .................. 10-2017-0098229

(51) Int. Cl.
  *H01L 23/532* (2006.01)
  *H01L 21/768* (2006.01)
  *H01L 21/02* (2006.01)

(52) U.S. Cl.
  CPC .. *H01L 23/53295* (2013.01); *H01L 21/02126* (2013.01); *H01L 21/02203* (2013.01); *H01L 21/02211* (2013.01); *H01L 21/02216* (2013.01); *H01L 21/02271* (2013.01); *H01L 21/02274* (2013.01); *H01L 21/02348* (2013.01); *H01L 21/76814* (2013.01); *H01L 21/76826* (2013.01); *H01L 21/76831* (2013.01); *H01L 21/76834* (2013.01); *H01L 23/5329* (2013.01)

(58) Field of Classification Search
  None
  See application file for complete search history.

(56) References Cited

U.S. PATENT DOCUMENTS

| | | | |
|---|---|---|---|
| 6,627,560 B1 * | 9/2003 | Miyano | C23C 16/401 257/E21.261 |
| 7,494,938 B2 | 2/2009 | Nguyen et al. | |
| 7,977,256 B2 | 7/2011 | Liu et al. | |

(Continued)

FOREIGN PATENT DOCUMENTS

KR    10-0540479    1/2006

OTHER PUBLICATIONS

Kim, "Characterization of Ultra Low-k SiOC(H) Film Deposited by Plasma-Enhanced Chemical Vapor Deposition (PECVD)" *Transactions on Electrical and Electronic Materials* 13(2):69-72 (2012).

*Primary Examiner* — Anthony Ho
*Assistant Examiner* — Kevin Quinto
(74) *Attorney, Agent, or Firm* — Myers Bigel, P.A.

(57) ABSTRACT

Embodiments of the present inventive concepts provide methods of forming an ultra-low-k dielectric layer and the ultra-low-k dielectric layer formed thereby. The method may include forming a first layer by supplying a precursor including silicon, oxygen, carbon, and hydrogen, performing a first ultraviolet process on the first layer to convert the first layer into a second layer, and performing a second ultraviolet process on the second layer under a process condition different from that of the first ultraviolet process.

19 Claims, 4 Drawing Sheets

(56) References Cited

U.S. PATENT DOCUMENTS

| | | |
|---|---|---|
| 8,293,662 B2 | 10/2012 | Nagaseki |
| 9,177,918 B2 | 11/2015 | Peng et al. |
| 9,653,400 B2 | 5/2017 | Yim et al. |
| 2009/0072403 A1* | 3/2009 | Ito .................... H01L 21/02126 257/751 |
| 2015/0262864 A1* | 9/2015 | Okamoto .......... H01L 21/31116 438/671 |
| 2016/0042943 A1 | 2/2016 | Ribaudo et al. |
| 2016/0307845 A1 | 10/2016 | Furuhashi |

* cited by examiner

METHODS OF FORMING AN ULTRA-LOW-K DIELECTRIC LAYER AND DIELECTRIC LAYERS FORMED THEREBY

CROSS-REFERENCE TO RELATED APPLICATION

This U.S. non-provisional patent application claims priority under 35 U.S.C. § 119 to Korean Patent Application No. 10-2017-0098229, filed on Aug. 2, 2017, in the Korean Intellectual Property Office, the disclosure of which is hereby incorporated by reference in its entirety.

BACKGROUND

Embodiments of the present inventive concepts relate to a method of forming an ultra-low-k dielectric layer and the ultra-low-k dielectric layer formed thereby.

Reliability of semiconductor devices may be deteriorated by the high integration density of the semiconductor devices. However, highly reliable semiconductor devices have been increasingly demanded with the development of the electronics industry. Thus, various research has been conducted on new techniques capable of improving reliability of semiconductor devices. In particular, various research has been conducted on techniques capable of reducing an interference phenomenon between interconnection lines very close to each other. For example, an air gap may be formed in an insulating layer between interconnection lines to reduce a dielectric constant of the insulating layer. However, mechanical strength of the insulating layer may be reduced.

SUMMARY

Embodiments of the present inventive concepts may provide methods of forming an ultra-low-k dielectric layer having both a low dielectric constant and excellent mechanical strength.

Embodiments of the present inventive concepts may also provide ultra-low-k dielectric layers having both a low dielectric constant and excellent mechanical strength.

Methods of forming an ultra-low-k dielectric layer according to some embodiments of the present inventive concepts may include forming a first layer by supplying a precursor including silicon, oxygen, carbon, and hydrogen, performing a first ultraviolet process on the first layer to convert the first layer into a second layer, and performing a second ultraviolet process on the second layer under a process condition different from that of the first ultraviolet process.

Ultra-low-k dielectric layers formed by the methods according to some embodiments of the present inventive concepts may be provided. In some embodiments, the ultra-low-k dielectric layers may include silicon, oxygen, carbon, and hydrogen and may have a porous structure including a plurality of pores. In some embodiments, a full width at half maximum (FWHM) of a pore size distribution of the pores may range from about 0.01 to about 0.7. In some embodiments, a ratio of a content of all Si—$CH_3$ bonds to a content of all Si—O bonds in the ultra-low-k dielectric layer may range from about 0.037 to about 0.053.

BRIEF DESCRIPTION OF THE DRAWINGS

The inventive concepts will become more apparent in view of the attached drawings and accompanying detailed description.

DETAILED DESCRIPTION

Hereinafter, example embodiments of the present inventive concepts will be described in more detail with reference to the accompanying drawings.

Figure 1:
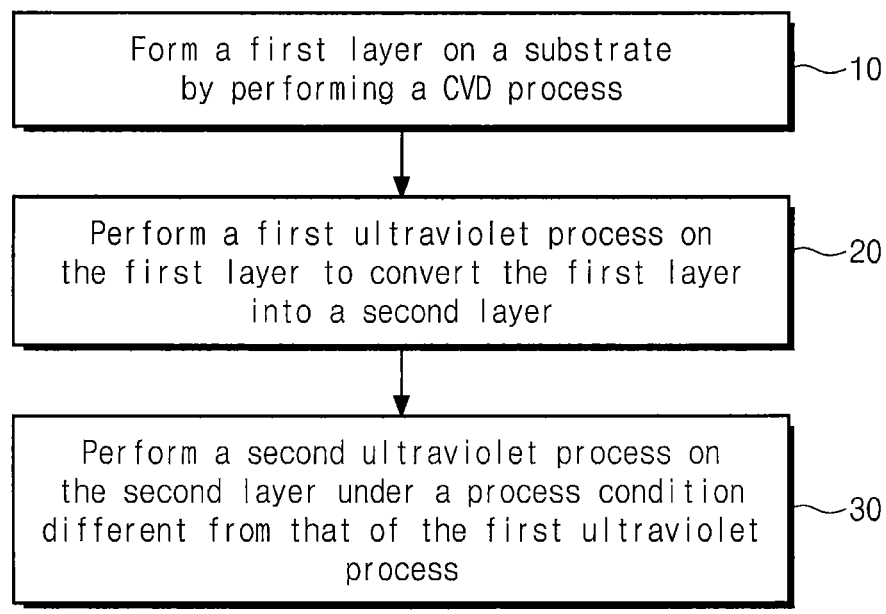
FIG. 1 is a flowchart illustrating a method of forming an ultra-low-k dielectric layer according to some embodiments of the present inventive concepts.
Figure 2A:
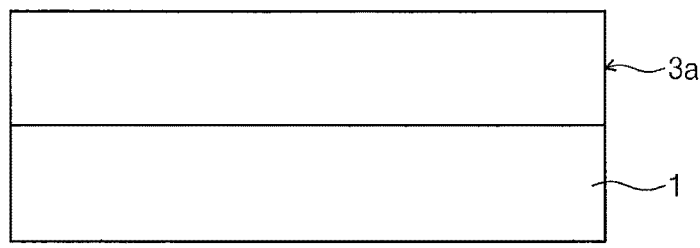
FIGS. 2A, 2B and 2C are cross-sectional views illustrating a method of forming an ultra-low-k dielectric layer according to some embodiments of the present inventive concepts.
Figure 2B:
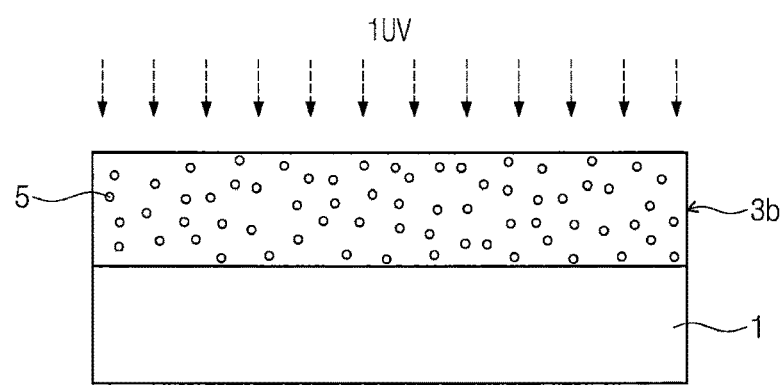
Figure 2C:
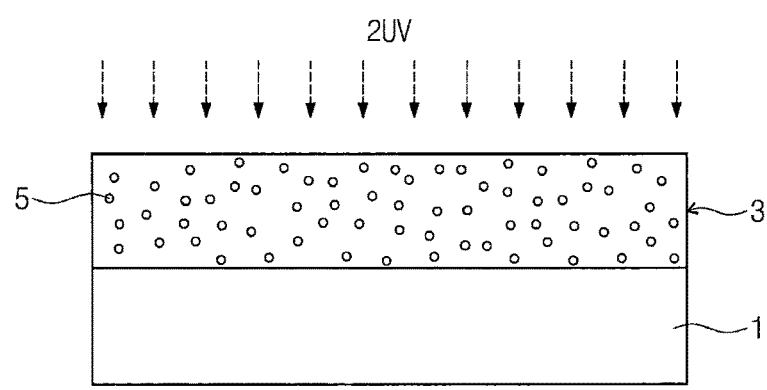

FIG. 1 is a flowchart illustrating a method of forming an ultra-low-k dielectric layer according to some embodiments of the present inventive concepts. FIGS. 2A, 2B and 2C are cross-sectional views illustrating a method of forming an ultra-low-k dielectric layer according to some embodiments of the present inventive concepts. It will be understood that "an ultra-low-k dielectric layer" refers to a dielectric layer having a dielectric constant equal to or less than about 2.7.

Referring to FIGS. 1 and 2A, a substrate 1 is prepared. For example, the substrate 1 may be a single-crystalline silicon wafer. Even though not shown in the drawings, a plurality of transistors, contact plugs and interconnection lines may be disposed on the substrate 1. A precursor including silicon, oxygen, carbon and hydrogen is supplied onto the substrate 1 to form a first layer 3a (Block 10). The first layer 3a may be deposited by performing a chemical vapor deposition (CVD) process (e.g., plasma-enhanced CVD process). The precursor may be octamethylcyclotetrasiloxane (OMCTS) that has a structure represented by the following chemical formula 1.

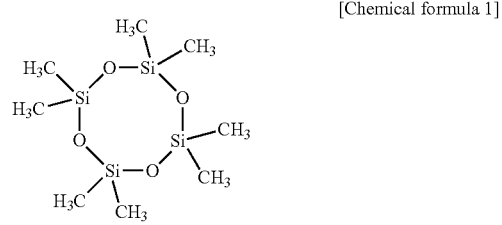

[Chemical formula 1]

In some embodiments, the CVD process is a PECVD process that may be performed at a first process temperature. The first process temperature may range from about 310° C. to about 330° C. If the first process temperature is higher than about 330° C., bonds between silicon atoms and methyl groups in the precursor may be broken during the PECVD process and the methyl groups may be removed in advance in the form of a gas such as methane. If the first layer 3a is deposited in the state in which the methyl groups are removed from the precursor, a content of pores in a finally formed ultra-low-k dielectric layer may be significantly reduced. This may cause an increase in dielectric constant. On the other hand, if the first process temperature is lower than 310° C., a density of the deposited first layer 3a may be very low, and thus it may be difficult for the finally formed ultra-low-k dielectric layer to have desired mechanical strength.

Oxygen and a porogen are not supplied during the PECVD process. For example, a nitrogen ($N_2$) gas may be used as a purge gas in the PECVD process. If oxygen is supplied during the PECVD process, oxygen may react with carbon of the OMCTS, and thus carbon may be removed in the form of $CO_2$. If the first layer 3a is deposited in the state in which a large amount of carbon is removed from the OMCTS, a content of pores in the finally formed ultra-low-k dielectric layer may be significantly reduced. This may cause an increase in dielectric constant. If the porogen is supplied in the PECVD process, a porosity of the finally formed ultra-low-k dielectric layer may increase but the mechanical strength of the finally formed ultra-low-k dielectric layer may be reduced and may cause a process failure. For example, a lower structure may collapse during a subsequent etching process.

Figure 3:
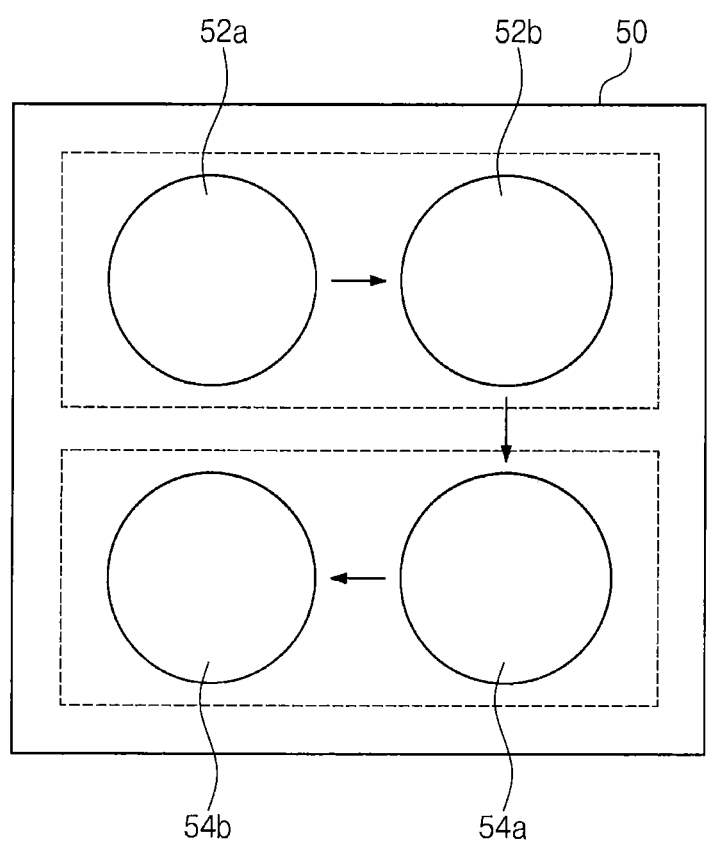
FIG. 3 is a schematic view illustrating an ultraviolet treatment apparatus according to some embodiments of the present inventive concepts.

FIG. 3 is a schematic view illustrating an ultraviolet treatment apparatus according to some embodiments of the present inventive concepts.

Referring to FIG. 3, an ultraviolet treatment apparatus 100 may include an ultraviolet chamber 50 and four zones 52a, 52b, 54a and 54b disposed in the ultraviolet chamber 50. The zones 52a, 52b, 54a and 54b may include a first zone 52a, a second zone 52b, a third zone 54a, and a fourth zone 54b. A first ultraviolet lamp that generates first ultraviolet light having a first wavelength may be located in the first zone 52a and the second zone 52b. A second ultraviolet lamp that generates second ultraviolet light having a second wavelength may be located in the third zone 54a and the fourth zone 54b. The first wavelength may be greater than the second wavelength. The first wavelength may range from about 315 nm to about 400 nm, and the first ultraviolet light may be UV-A. The second wavelength may range from about 100 nm to about 280 nm, and the second ultraviolet light may be UV-C. The ultraviolet chamber 50 may be maintained at a second process temperature. The second process temperature may be higher than the first process temperature. For example, the second process temperature may range from about 390° C. to about 410° C. A wafer loaded in the ultraviolet chamber 50 may be exposed to the first ultraviolet light in the first zone 52a for a first process time and may be exposed to the first ultraviolet light in the second zone 52b for a second process time. Subsequently, the wafer may be exposed to the second ultraviolet light in the third zone 54a for a third process time and may be exposed to the second ultraviolet light in the fourth zone 54b for a fourth process time. Thereafter, the wafer may be transferred out of the ultraviolet chamber 50.

Referring to FIGS. 1, 2B, and 3, a first ultraviolet process 1UV is performed with respect to (e.g., on, for) the first layer 3a (Block 20). In detail, the substrate 1 on which the first layer 3a is deposited is loaded into the ultraviolet chamber 50 of FIG. 3. The first layer 3a may be exposed to the first ultraviolet light through the first zone 52a and the second zone 52b. The wavelength of the first ultraviolet light may be longer than that of the second ultraviolet light but energy of the first ultraviolet light may be less than that of the second ultraviolet light. In the first ultraviolet process 1UV, the first ultraviolet light may break the bond between the silicon atoms and the methyl groups in the first layer 3a. Thus, the methyl groups may be gasified in the form of methane and thus be removed, and pores 5 may be formed at places from which the methyl groups are removed. As a result, the first layer 3a may be converted into a second layer 3b that includes a lot of pores or has a low density (or low bonding strength between atoms). In other words, the first layer 3a may be converted into the second layer 3b having an ultra-low dielectric constant by the first ultraviolet process 1UV.

Referring to FIGS. 1, 2C, and 3, a second ultraviolet process 2UV is performed with respect to the second layer 3b under a process condition different from that of the first ultraviolet process 1UV (Block 30). In more detail, the second layer 3b may be exposed to the second ultraviolet light through the third zone 54a and the fourth zone 54b. The wavelength of the second ultraviolet light may be shorter than that of the first ultraviolet light but the energy of the second ultraviolet light may be greater than that of the first ultraviolet light. Thus, the silicon atoms from which the methyl groups are separated may be bonded to oxygen to form a firm Si—O structure. As a result, the second layer 3b may be converted into a densified ultra-low-k dielectric layer 3. In other words, the second layer 3b may be converted into the ultra-low-k dielectric layer 3 having a high mechanical strength by the second ultraviolet process 2UV.

If an ultraviolet process is performed using ultraviolet light having a single wavelength unlike the first and second ultraviolet processes using the first and second ultraviolet lights of different wavelengths, it may be difficult to control both removal of methyl groups (e.g., carbon) and densification. Thus, it may be difficult to form an ultra-low-k dielectric layer having a desired dielectric constant and a desired mechanical strength.

A sum of the first to fourth process times may range from about 2 minutes to about 8 minutes. The first to fourth process times may be equal to each other. For example, when the sum of the first to fourth process times is about 2 minutes, each of the first to fourth process times may be about 30 seconds. When the sum of the first to fourth process times is about 8 minutes, each of the first to fourth process times may be about 2 minutes. If the sum of the first to fourth process times is less than 2 minutes, an amount of carbon removed may be small, and thus the number of pores formed in the ultra-low-k dielectric layer 3 may be small. Therefore, it may be difficult to form a layer having an ultra-low dielectric constant. If the sum of the first to fourth process times is greater than 8 minutes, the amount of carbon removed may be too much, and the number of pores formed in the ultra-low-k dielectric layer 3 may be too much. Thus, mechanical strength of a finally formed layer may be weak.

Referring to FIG. 2C, the ultra-low-k dielectric layer 3 formed according to some embodiments of the present inventive concepts may include silicon, oxygen, carbon, and hydrogen and may have a porous structure including a plurality of the pores 5. A content of the carbon in the ultra-low-k dielectric layer 3 may range from about 30 at. % to about 35 at. %. A porosity, which is a ratio of a volume occupied by the pores 5 to a total volume of the ultra-low-k dielectric layer 3 multiplied by 100%, may range from about 10% to about 15%. For example, a volume of the pores 5 may be 10-15% of the total volume of the ultra-low-k dielectric layer 3. Diameters of the pores 5 may range from about 0.8 nm to about 1.0 nm. A full width at half maximum (FWHM) of a pore size distribution of the pores 5 may range from about 0.01 to about 0.7. As a result, the ultra-low-k dielectric layer 3 formed by the method according to the present inventive concepts may include the small pores 5 of which sizes are very uniform. The ultra-low-k dielectric layer 3 having these pores 5 may have both the relatively low dielectric constant and the high mechanical strength. The dielectric constant of the ultra-low-k dielectric layer 3 may range from 2.6 to 2.7. A Young's modulus of the ultra-low-k dielectric layer 3, which means the mechanical strength, may range from about 11 GPa to about 300 GPa.

Next, an experimental example will be described in detail.

Manufacturing Example 1

A PECVD process was performed at 320° C. by supplying OMCTS at a flow rate of 3300 sccm, and thus a first layer (e.g., the layer 3a of FIG. 2A) with a thickness of about 1500 Å was deposited on a single-crystalline silicon wafer. At this time, helium was used as a carrier gas and nitrogen was used as a purge gas. The carrier gas was supplied at a flow rate of 1500 sccm. High frequency (HF) power was 400 W in the PECVD process. In a PECVD apparatus, a spacing between the wafer and a shower head was about 400 mil. At this time, oxygen and a porogen were not supplied. The wafer on which the first layer was deposited was loaded into the ultraviolet treatment apparatus 100, and a first ultraviolet process was performed using first ultraviolet light of a wavelength of 400 nm on the wafer for 1 minute in the first zone 52a and the second zone 52b. Thus, the first layer was converted into a second layer (e.g., the layer 3b of FIG. 2B). Subsequently, a second ultraviolet process was performed using second ultraviolet light of a wavelength of 280 nm on the wafer for 1 minute in the third zone 54a and the fourth zone 54b, thereby forming an ultra-low-k dielectric layer (e.g., the layer 3 of FIG. 2C). A temperature of the ultraviolet treatment apparatus was about 400° C.

Manufacturing Example 2

In the manufacturing example 2, the first ultraviolet process was performed for 4 minutes and the second ultraviolet process was performed for 4 minutes, thereby forming an ultra-low-k dielectric layer (e.g., the layer 3 of FIG. 2C). Other conditions of the manufacturing example 2 were the same as corresponding conditions of the manufacturing example 1.

Comparative Example 1

A PECVD process was performed at 350° C. by supplying OMCTS at a flow rate of 3300 sccm and oxygen at a flow rate of 144 sccm, and thus a SiOCH layer with a thickness of about 1500 Å was deposited on a wafer. At this time, helium was used as a carrier gas and nitrogen was used as a purge gas. The carrier gas was supplied at a flow rate of 3500 sccm. In the PECVD process, high frequency (HF) power was 400 W and low frequency (LF) power was 90 W. In a PECVD apparatus, a spacing between the wafer and a shower head was about 290 mil. Ultraviolet treatment was not performed.

Comparative Example 2

A PECVD process was performed at 350° C. by supplying m-diethoxymethylsilane (m-DEOS) as a silicon precursor at a flow rate of 3000 sccm and a-terpinene (ATRP) as a porogen at a flow rate of 300 sccm, and thus a SiOCH layer with a thickness of about 1500 Å was deposited on a wafer. At this time, helium was used as a carrier gas and nitrogen was used as a purge gas. The carrier gas was supplied at a flow rate of 3500 sccm. In the PECVD process, high frequency (HF) power was 400 W and low frequency (LF) power was 90 W. In a PECVD apparatus, a spacing between the wafer and a shower head was about 290 mil. In addition, the SiOCH layer was treated by ultraviolet light of a wavelength of 280 nm for 6 minutes.

Figure 4:
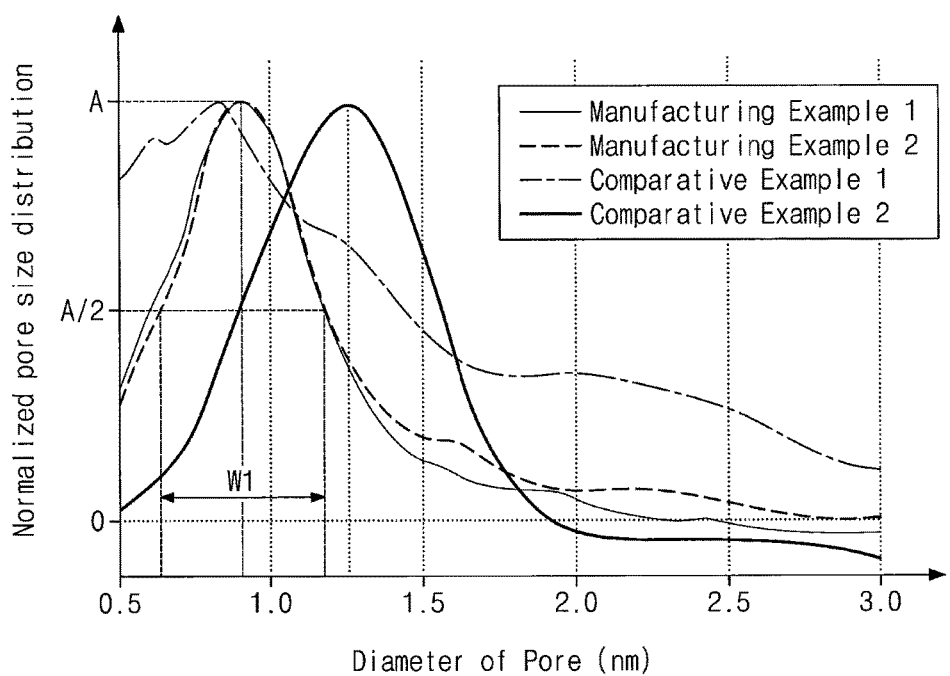
FIG. 4 is a graph illustrating pore size distributions according to diameters of pores contained in layers formed in manufacturing examples 1 and 2 of the present inventive concepts and comparative examples 1 and 2.

Sizes and distributions of pores contained in the layers formed in the manufacturing examples 1 and 2 and the comparative examples 1 and 2 were measured and the measured results were shown in FIG. 4.

Referring to FIG. 4, diameters of the pores in the layers formed by the manufacturing examples 1 and 2 of the present inventive concepts are concentrated near about 0.9 nm. On the contrary, diameters of the pores in the layer formed by the comparative example 1 are widely distributed in a range of 0.5 nm to 3 nm. Diameters of the pores in the layer formed by the comparative example 2 are distributed around about 1.25 nm are distributed more widely than those of the pores in the layers formed by the manufacturing examples 1 and 2. A FWHM may be calculated using the data. For example, in the graph of the manufacturing example 2, the FWHM may be calculated using a width W1 of the graph at a point which corresponds to a half value A/2 of the maximum value A of a normalized pore size distribution. Sizes of the pores become more uniform as the FWHM decreases.

Characteristics of the layers formed in the manufacturing examples 1 and 2 and the comparative examples 1 and 2 are shown in the following Table 1.

TABLE 1

|  | Dielectric constant | Porosity (%) | Average pore diameter (nm) | FWHM | Young's modulus (GPa) |
|---|---|---|---|---|---|
| Manufacturing example 1 | 2.62 | 10.74 | 0.90 | 0.647 | 11.01 |
| Manufacturing example 2 | 2.68 | 13.10 | 0.91 | 0.657 | 11.10 |
| Comparative example 1 | 2.95 | 4.41 | 0.79 | 1.160 | 11.20 |
| Comparative example 2 | 2.52 | 21.68 | 1.26 | 0.728 | 8.00 |

Referring to the Table 1, the ultra-low-k dielectric layers of the manufacturing examples 1 and 2 of the present inventive concepts have dielectric constants lower than that of the SiOCH layer of the comparative example 1 and have FWHMs smaller than that of the SiOCH layer of the comparative example 1. Thus, the ultra-low-k dielectric layers of the manufacturing examples 1 and 2 have substantially uniform pore sizes. On the other hand, the SiOCH layer of the comparative example 2 has a dielectric constant lower than those of the ultra-low-k dielectric layers of the manufacturing examples 1 and 2 and a porosity higher than those of the ultra-low-k dielectric layers of the manufacturing examples 1 and 2. However, the SiOCH layer of the comparative example 2 has a low Young's modulus (8.00 GPa) corresponding to the mechanical strength. Thus, if the SiOCH layer of the comparative example 2 is applied to a semiconductor device, a possibility that defects occur may increase. As a result, the ultra-low-k dielectric layer formed by the method according to the present inventive concepts may include small and uniform pores and thus may have both the excellent mechanical strength and the low dielectric constant. When the ultra-low-k dielectric layer according to the present inventive concepts is applied to a semiconductor device, a process failure may be reduced by the excellent mechanical strength and an interference phenomenon between interconnection lines may be reduced or possibly minimized by the low dielectric constant. Thus, high-speed and highly integrated semiconductor devices may be realized.

In the layers of the manufacturing example 1 and the comparative examples 1 and 2, bonds of silicon atoms and methyl groups may be in three forms. Specifically, one silicon atom may be bonded to one methyl group, two methyl groups, or three methyl groups. In the layers of the manufacturing example 1 and the comparative examples 1 and 2, bonds of silicon atoms and oxygen atoms may be in three forms. Specifically, in a first form, a bond angle of the silicon atom and the oxygen atom may be less than 140 degrees. In a second form, the bond angle of the silicon atom and the oxygen atom may range from about 140 degrees to about 148 degrees. In a third form, the bond angle of the silicon atom and the oxygen atom may range from about 148 degrees to about 150 degrees.

Next, Fourier transform infrared (FT-IR) spectra of the layers formed in the manufacturing example 1 and the comparative examples 1 and 2 were obtained, and the obtained FT-IR spectra were analyzed to obtain data on contents of the bonds of the silicon atoms and the methyl groups and contents of the bonds of the silicon atoms and the oxygen atoms in the layers. Ratios of these contents were calculated, and the calculated results were shown in the following Tables 2 and 3.

TABLE 2

|  | Manufacturing example 1 | Comparative example 1 | Comparative example 2 |
| --- | --- | --- | --- |
| Si—$CH_3$(1)/Si—O(n) | 0.382 | 0.038 | 0.062 |
| Si—$CH_3$(2)/Si—O(n) | 0.267 | 0.026 | 0.011 |
| Si—$CH_3$(3)/Si—O(n) | 0.053 | 0.002 | 0.000 |
| Si—$CH_3$(t)/Si—O(n) | 0.702 | 0.066 | 0.073 |

TABLE 3

|  | Manufacturing example 1 | Comparative example 1 | Comparative example 2 |
| --- | --- | --- | --- |
| Si—$CH_3$(1)/Si—O(t) | 0.024 | 0.018 | 0.018 |
| Si—$CH_3$(2)/Si—O(t) | 0.017 | 0.012 | 0.003 |
| Si—$CH_3$(3)/Si—O(t) | 0.003 | 0.001 | 0.000 |
| Si—$CH_3$(t)/Si—O(t) | 0.044 | 0.031 | 0.021 |

In the Tables 2 and 3, "Si—$CH_3$(1)" refers to a content of the bond in which one silicon atom is bonded to one methyl group. "Si—$CH_3$(2)" refers to a content of the bond in which one silicon atom is bonded to two methyl groups. "Si—$CH_3$(3)" refers to a content of the bond in which one silicon atom is bonded to three methyl groups. "Si—$CH_3$(t)" refers to a total content of all bonds, each of which is the bond of one silicon atom and at least one methyl group (regardless of the number of the methyl group(s)). "Si—O(n)" refers to a content of the bond of the silicon atom and the oxygen atom when the bond angle of the silicon atom and the oxygen atom (Si—O bond angle) ranges from about 140 degrees to about 148 degrees. "Si—O(t)" refers to a total content of all bonds, each of which is the bond of the silicon atom and the oxygen atom regardless of the bond angle. It will be understood that "a content of the bond in which one silicon atom is bonded to one methyl group Si—$CH_3$(1)" refers to a ratio of the number of the bonds in which one silicon atom is bonded to one methyl group to the number of the bonds in which one silicon atom is bonded to at least one methyl group.

In the Table 2, a sum of values of Si—$CH_3$(1)/Si—O(n), Si—$CH_3$(2)/Si—O(n) and Si—$CH_3$(3)/Si—O(n) may be equal to a value of Si—$CH_3$(t)/Si—O(n). In the table 3, a sum of values of Si—$CH_3$(1)/Si—O(t), Si—$CH_3$(2)/Si—O(t) and Si—$CH_3$(3)/Si—O(t) may be equal to a value of Si—$CH_3$(t)/Si—O(t).

As shown in the Table 2, in the layer formed in the manufacturing example 1 of the present inventive concepts, Si—$CH_3$(1)/Si—O(n) is 0.382, Si—$CH_3$(2)/Si—O(n) is 0.267, Si—$CH_3$(3)/Si—O(n) is 0.053, and Si—$CH_3$(t)/Si—O(n) corresponding to the sum thereof is 0.702. These values of the layer of the manufacturing example 1 of the present inventive concepts are greater than corresponding values of the comparative examples 1 and 2, respectively.

As shown in the Table 3, in the layer formed in the manufacturing example 1 of the present inventive concepts, Si—$CH_3$(1)/Si—O(t) is 0.024, Si—$CH_3$(2)/Si—O(t) is 0.017, Si—$CH_3$(3)/Si—O(t) is 0.003, and Si—$CH_3$(t)/Si—O(t) corresponding to the sum thereof is 0.044. These values of the layer of the manufacturing example 1 of the present inventive concepts are greater than corresponding values of the comparative examples 1 and 2, respectively. Thus, it may be recognized that a large amount of the pores with respect to Si—O bonds are generated in the layer formed in the manufacturing example 1 of the present inventive concepts. In addition, it may be recognized that the bond structure of the layer formed in the manufacturing example 1 of the present inventive concepts is different from those of the layers formed in the comparative examples 1 and 2.

Only the results of the manufacturing example 1 are described in the present specification. However, ultra-low-k dielectric layers were formed by the method of the present inventive concepts while changing a process condition, and the ultra-low-k dielectric layers were analyzed. As a result, in the ultra-low-k dielectric layer according to the present inventive concepts, Si—$CH_3$(1)/Si—O(n) ranges from about 0.2 to about 0.4, Si—$CH_3$(2)/Si—O(n) ranges from about 0.1 to about 0.35, Si—$CH_3$(3)/Si—O(n) ranges from about 0.01 to about 0.1, and Si—$CH_3$(t)/Si—O(n) ranges from about 0.31 to about 0.85. In addition, in the ultra-low-k dielectric layer according to the present inventive concepts, Si—$CH_3$(1)/Si—O(t) ranges from about 0.02 to about 0.03, Si—$CH_3$(2)/Si—O(t) ranges from about 0.015 to about 0.019, Si—$CH_3$(3)/Si—O(t) ranges from about 0.002 to about 0.004, and Si—$CH_3$(t)/Si—O(t) ranges from about 0.037 to about 0.053. The ultra-low-k dielectric layer according to the present inventive concepts may have the low dielectric constant and the high mechanical strength by these structural characteristics.

In the ultra-low-k dielectric layer formed by the formation method according to some embodiments of the present inventive concepts, the pores included therein may have the small and uniform sizes. Thus, the ultra-low-k dielectric layer may have both the low dielectric constant and the excellent mechanical strength.

While the present inventive concepts have been described with reference to example embodiments, it will be apparent to those skilled in the art that various changes and modifications may be made without departing from the spirits and scopes of the present inventive concepts. Therefore, it should be understood that the above embodiments are not limiting, but illustrative. Thus, the scopes of the present inventive concepts are to be determined by the broadest permissible interpretation of the following claims and their equivalents, and shall not be restricted or limited by the foregoing description.

What is claimed is:

1. A method of forming an ultra-low-k dielectric layer, the method comprising:
   forming a first layer by supplying a precursor including silicon, oxygen, carbon, and hydrogen;
   performing a first ultraviolet process on the first layer to convert the first layer into a second layer; and
   performing a second ultraviolet process on the second layer under a process condition different from that of the first ultraviolet process,
   wherein oxygen and a porogen are not supplied while forming the first layer.

2. The method of claim 1, wherein forming the first layer comprises performing a chemical vapor deposition process at a temperature ranging from about 310° C. to about 330° C.

3. The method of claim 1, wherein the precursor includes octamethylcyclotetrasiloxane (OMCTS).

4. The method of claim 1, wherein the first ultraviolet process is performed for a first process time,
   wherein the second ultraviolet process is performed for a second process time, and
   wherein a sum of the first process time and the second process time ranges from about 2 minutes to about 8 minutes.

5. The method of claim 1, wherein the first ultraviolet process is performed using ultraviolet light of a first wavelength,
   wherein the second ultraviolet process is performed using ultraviolet light of a second wavelength, and
   wherein the first wavelength is greater than the second wavelength.

6. The method of claim 5, wherein the first wavelength ranges from about 315 nm to about 400 nm, and
   wherein the second wavelength ranges from about 100 nm to about 280 nm.

7. The method of claim 1, wherein forming the first layer is performed at a first process temperature,
   wherein the first ultraviolet process and the second ultraviolet process are performed at a second process temperature, and
   wherein the first process temperature is lower than the second process temperature.

8. The method of claim 7, wherein the first process temperature ranges from about 310° C. to about 330° C., and
   wherein the second process temperature ranges from about 390° C. to about 410° C.

9. An ultra-low-k dielectric layer formed by the method of claim 1.

10. The ultra-low-k dielectric layer of claim 9, wherein the ultra-low-k dielectric layer includes silicon, oxygen, carbon, and hydrogen and has a porous structure including a plurality of pores, and
    wherein a full width at half maximum (FWHM) of a pore size distribution of the plurality of pores ranges from about 0.01 to about 0.7.

11. The ultra-low-k dielectric layer of claim 10, wherein the ultra-low-k dielectric layer has a porosity of about 10% to about 15%.

12. The ultra-low-k dielectric layer of claim 10, wherein diameters of the plurality of pores range from about 0.8 nm to about 1.0 nm.

13. The ultra-low-k dielectric layer of claim 10, wherein a content of the carbon in the ultra-low-k dielectric layer ranges from about 30 at. % to about 35 at. %.

14. The ultra-low-k dielectric layer of claim 10, wherein a dielectric constant of the ultra-low-k dielectric layer ranges from about 2.6 to about 2.7.

15. The ultra-low-k dielectric layer of claim 10, wherein a Young's modulus of the ultra-low-k dielectric layer ranges from about 11 GPa to about 300 GPa.

16. An ultra-low-k dielectric layer comprising silicon, oxygen, carbon, and hydrogen and having a porous structure including a plurality of pores,
    wherein a content of the carbon in the ultra-low-k dielectric layer ranges from about 30 at. % to about 35 at. %, and
    wherein, in the ultra-low-k dielectric layer, a ratio of a content of all Si—$CH_3$ bonds to a content of all Si—O bonds ranges from about 0.037 to about 0.053.

17. The ultra-low-k dielectric layer of claim 16, wherein a full width at half maximum (FWHM) of a pore size distribution of the plurality of pores ranges from about 0.01 to about 0.7.

18. The ultra-low-k dielectric layer of claim 16, wherein diameters of the plurality of pores range from about 0.8 nm to about 1.0 nm.

19. The ultra-low-k dielectric layer of claim 16, wherein, in the ultra-low-k dielectric layer, a ratio of the content of all Si—$CH_3$ bonds to a content of Si—O bonds, each of which Si—O bonds has a Si—O bond angle of 140 degrees to 148 degrees, ranges from about 0.31 to about 0.85.

\* \* \* \* \*